United States Patent
Chung et al.

(10) Patent No.: US 7,353,078 B2
(45) Date of Patent: Apr. 1, 2008

(54) SEMICONDUCTOR WAFER PROCESSING APPARATUS AND METHOD FOR PROCESSING BATCH OF WAFERS HAVING VARIABLE NUMBER OF WAFER LOTS

(75) Inventors: Jae-Woo Chung, Seoul (KR); Jun Jung, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/474,385

(22) Filed: Jun. 26, 2006

(65) Prior Publication Data

US 2007/0038327 A1 Feb. 15, 2007

(30) Foreign Application Priority Data

Aug. 12, 2005 (KR) ............ 10-2005-0074253

(51) Int. Cl.
*G06F 19/00* (2006.01)
(52) U.S. Cl. .............. 700/121; 700/100; 700/108; 702/83; 707/1; 707/104.1
(58) Field of Classification Search .......... 700/95, 700/100, 108, 109, 117, 121; 702/81, 83; 707/1, 10, 104.1
See application file for complete search history.

(56) References Cited

U.S. PATENT DOCUMENTS

| | | | |
|---|---|---|---|
| 6,035,293 A * | 3/2000 | Lantz et al. .............. 707/1 |
| 6,698,009 B1 * | 2/2004 | Pasadyn et al. .............. 716/19 |
| 6,732,007 B1 | 5/2004 | Pasadyn et al. |
| 6,745,142 B2 | 6/2004 | Fu et al. |
| 6,834,211 B1 | 12/2004 | Coss, Jr. et al. |
| 6,871,112 B1 * | 3/2005 | Coss et al. .............. 700/121 |
| 6,907,306 B2 * | 6/2005 | Hsieh et al. .............. 700/108 |
| 6,959,225 B1 * | 10/2005 | Logsdon et al. .............. 700/100 |
| 6,961,634 B1 * | 11/2005 | Logsdon et al. .............. 700/100 |
| 6,988,017 B2 * | 1/2006 | Pasadyn et al. .............. 700/121 |
| 7,146,237 B2 * | 12/2006 | Lev-Ami et al. .............. 700/121 |
| 7,167,811 B2 * | 1/2007 | Tabor .............. 702/183 |
| 2005/0228529 A1 * | 10/2005 | Lev-Ami et al. .............. 700/121 |

* cited by examiner

*Primary Examiner*—Leo Picard
*Assistant Examiner*—Douglas S Lee
(74) *Attorney, Agent, or Firm*—Volentine & Whitt, PLLC

(57) ABSTRACT

Disclosed is a semiconductor processing apparatus for processing batches of wafers with variable numbers of wafer lots. The apparatus includes an operator interface server adapted to receive batch information for a track-in operation, an equipment management server adapted to store data used to process the batch of wafers, and a device interface server adapted to control a selected unit of processing equipment used to process the batch of wafers. The batch information is transmitted from the operator interface server to the device interface server, and the device interface server attempts to set a sub-recipe in the selected unit of processing equipment based on the batch information. After the sub-recipe is set in the selected unit of processing equipment, the device interface server then attempts to set a process recipe in the device interface server.

16 Claims, 6 Drawing Sheets

FIG. 4

SUB RECIPE

| |
|---|
| USE - MW1 - CASSETTE → 1LOT<br>　　　　　　　　WAFER → MW OK<br>USE - MW2 - CASSETTE → 2LOT<br>　　　　　　　　WAFER → MW OK<br>USE - MW3 - CASSETTE → 3LOT<br>　　　　　　　　WAFER → MW OK<br>USE - MW4 - CASSETTE → 4LOT<br>　　　　　　　　WAFER → MW OK<br>USE - MW5 - CASSETTE → 5LOT<br>　　　　　　　　WAFER → MW OK<br>USE - MW6 - CASSETTE → 6LOT<br>　　　　　　　　WAFER → MW OK |
| NO - MW1 - CASSETTE → 1LOT<br>　　　　　　　WAFER → MW NO<br>NO - MW2 - CASSETTE → 2LOT<br>　　　　　　　WAFER → MW NO<br>NO - MW3 - CASSETTE → 3LOT<br>　　　　　　　WAFER → MW NO<br>NO - MW4 - CASSETTE → 4LOT<br>　　　　　　　WAFER → MW NO<br>NO - MW5 - CASSETTE → 5LOT<br>　　　　　　　WAFER → MW NO<br>NO - MW6 - CASSETTE → 6LOT<br>　　　　　　　WAFER → MW NO |

SEMICONDUCTOR WAFER PROCESSING APPARATUS AND METHOD FOR PROCESSING BATCH OF WAFERS HAVING VARIABLE NUMBER OF WAFER LOTS

BACKGROUND OF THE INVENTION

1. Field of the Invention

Embodiments of the present invention relate generally to semiconductor wafer processing apparatuses and associated methods. More particularly, embodiments of the invention relate to semiconductor production apparatuses capable of processing batches of wafers including variable numbers of wafer lots.

A claim of priority is made to Korean Patent Application No. 10-2005-0074253, filed Aug. 12, 2005, the disclosure of which is hereby incorporated by reference in its entirety.

2. Discussion of Related Art

Semiconductor devices are manufactured by constructing layers of insulating and conducting materials on wafers of silicon to form intricate circuit patterns giving the devices their functionality. The manufacturing processes used to form the layers typically include hundreds of different processing steps performed under a variety of different processing conditions. These steps include, for example, cleaning, diffusion, photoresist coating, exposure, developing, etching, ion implantation, and so on. The processing steps generally require intricate timing and process flow specifications including interrelationships between the different steps.

A "recipe" is a codified description that provides some or all of the ingredients, process steps, and machine and equipment operations involved in manufacturing a particular semiconductor device. Due to the large number of processing steps and the interrelatedness of processing inputs involved in most recipes, it is often difficult to specify optimal ranges for all of the inputs to a recipe. Moreover, there may be variation in the way that different pieces of processing equipment perform different processing steps according to a particular recipe. Accordingly, empirical evaluations of a recipe's performance with respect to a particular piece of processing equipment are often carried out after performing selected processing steps so that adjustments to the recipe can be made to improve its performance in subsequent wafer processing.

For example, after a recipe is carried out to produce a semiconductor device, the device may be inspected for defects. If the inspection indicates that the recipe produces defective devices, the processing equipment used to carry out the recipe will typically halt execution and generate a warning so that an engineer can evaluate the cause of the defects and attempt to resolve them by making adjustments to the recipe or the processing equipment. If the engineer is able to resolve the defects through adjusting the recipe or the processing equipment, then the processing equipment is allowed to resume performing its functions.

The recipes used with a set of semiconductor processing equipment are typically stored in a database connected to the equipment. For example, most modern semiconductor processing equipment comprises a host computer adapted to store the recipes.

Semiconductor manufacturing processes are often carried out on many wafers at a time. A group of semiconductor wafers that are processed together is commonly referred to as a "wafer lot." A typical wafer lot includes between 20 and 25 wafers. In addition, some semiconductor manufacturing processes are carried out on batches of wafers, where a batch includes multiple lots of wafers. A typical batch of wafers includes between 1 and 6 wafer lots.

When many wafers are processed at the same time, one of the wafers may be designated as, a monitoring wafer. The monitoring wafer may be inspected and the inspection of the monitoring wafer may be used to infer the quality of processes concurrently performed on other wafers.

Semiconductor processing equipment used to process multiple batches of wafers at a time will be referred to as "batch-type semiconductor processing equipment" in this written description. A single unit of batch-type semiconductor processing equipment can often be used to process variable-sized batches of wafers, or in other words, batches of wafers having a variable number of lots.

Most batch-type semiconductor processing equipment operates according to a table that specifies the number of lots processed and whether or not a monitoring wafer is used to judge the quality of the processed wafers. In the absence of such a table, the wafers may be inappropriately processed because the process settings for processing one number of lots (e.g., 4) is different from the process settings used to process a different number of lots (e.g., 6).

SUMMARY OF THE INVENTION

According to one embodiment of the invention, a semiconductor wafer processing apparatus capable of processing a batch of wafers having a variable number of wafer lots is provided. The apparatus comprises an operator interface, an equipment management server, and a device interface server connected to a plurality of processing equipment units. The operator interface server receives inputs indicating process conditions for processing the batch of wafers in a selected unit of wafer processing equipment, the number of wafer lots in the batch of wafers, and whether or not to use a monitor wafer when processing the batch of wafers. The equipment management server provides the operator interface server with process condition data used to derive the process conditions. The device interface server provides a communication interface between the operator interface server and the selected unit of processing equipment, receives batch information for a track-in operation from the operator interface server, and sets a recipe in the selected unit of processing equipment based on the batch information.

According to another embodiment of the invention, a method of processing a batch wafers having a variable number of wafer lots is provided. The method is performed in a semiconductor wafer processing apparatus comprising an operator interface server adapted to receive batch information for a track-in operation, an equipment management server adapted to store data used to process the batch of wafers, and a device interface server adapted to control a selected unit of processing equipment used to process the batch of wafers. The method comprises inputting the batch information for the track-in operation to the operator interface server, transmitting the batch information to the device interface server and updating the batch information in the device interface server; setting a sub-recipe in the selected unit of the processing equipment after updating the batch information, setting a process recipe in the selected unit of processing equipment after setting the sub-recipe, and processing the batch of wafers in the selected unit of processing equipment based on the process recipe.

According to another embodiment of the invention, another method of processing a batch of wafers containing a variable number of wafer lots is provided. The method is performed in a semiconductor apparatus comprising an operator interface server adapted to receive batch information for a track-in operation, an equipment management server adapted to store data used to process the batch of wafers, and a device interface server adapted to control a selected unit of processing equipment used to process the batch of wafers. The method comprises inputting batch information to the operator interface server. The batch information indicates the number of wafer lots in the batch of wafers and whether or not to use a monitor wafer to monitor the processes performed on the batch of wafers. The method further comprises transmitting the batch information to the device interface server and updating the batch information in a device interface server, determining whether a sub-recipe is stored in a selected unit of processing equipment after updating the batch information, and performing failure processing when the sub-recipe is not present in the selected unit of processing equipment. The method further comprises setting the sub-recipe in the selected unit of processing equipment when the sub-recipe is present in the selected processing equipment, determining whether or not the selected unit of processing equipment becomes converted into a standby mode after the sub-recipe is set, determining whether or not a process recipe is stored in the selected unit of processing equipment after the selected unit of processing equipment is converted into the standby mode, setting the process recipe in the selected unit of processing equipment when the process recipe is stored in the selected unit of processing equipment, determining whether or not the selected unit of processing equipment becomes converted into the standby mode after the process recipe is set, and processing the batch of wafers according to the process recipe when the selected unit of processing equipment is converted into the standby mode.

BRIEF DESCRIPTION OF THE DRAWINGS

The invention is described below in relation to several embodiments illustrated in the accompanying drawings. Throughout the drawings like reference numbers indicate like exemplary elements, components, or steps. In the drawings.

DESCRIPTION OF EXEMPLARY EMBODIMENTS

Exemplary embodiments of the invention are described below with reference to the corresponding drawings. These embodiments are presented as teaching examples. The actual scope of the invention is defined by the claims that follow.

Figure 1:
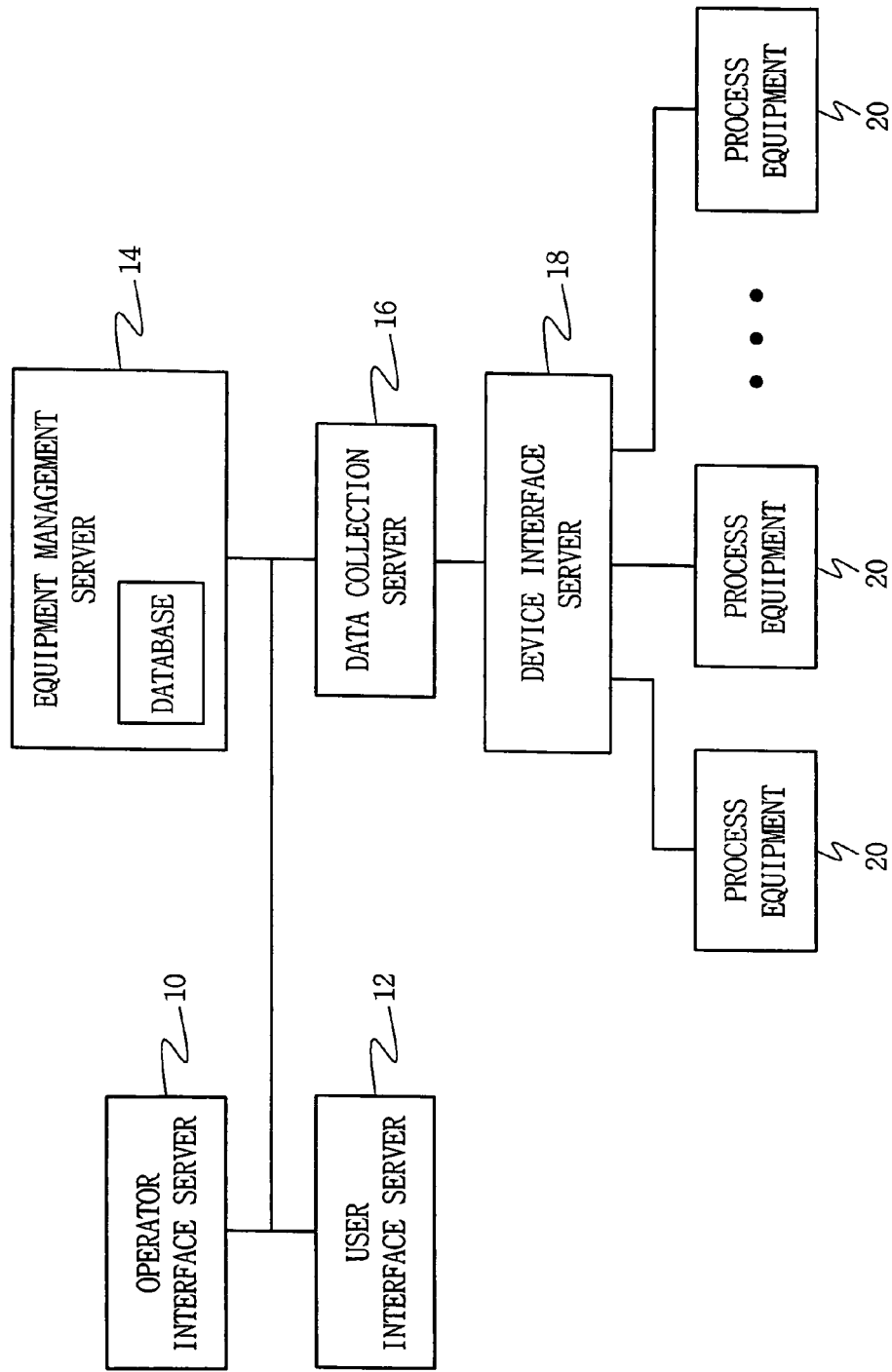
FIG. 1 is a block diagram illustrating a system for managing several units of processing equipment in accordance with an embodiment of the invention.

FIG. 1 is a block diagram illustrating a system for managing several units of processing equipment in accordance with an embodiment of the present invention.

Referring to FIG. 1, the system comprises an operator interface server 10, a user interface server 12, an equipment management server 14, a data collection server 16, a device interface server 18, and several units of processing equipment 20 used to process semiconductor wafers during the manufacture of semiconductor devices.

Operator interface server 10 receives inputs defining process conditions for various processes to be performed by the units of processing equipment 20. In addition, operator interface server 10 also receives inputs indicating whether a monitoring wafer will be used to monitor wafers processed by the various processes, the number of wafer lots to be processed by the processes, and the positions of slots where the wafers will be inserted into the units of processing equipment 20 before performing the various processes. Operator interface server is operatively connected to equipment management server 14, data collection server 16, and user interface server 12.

User interface server 12 provides a user interface that allows an engineer to inspect various states of processing equipment 20 from a remote location. User interface server 12 is operatively connected to operator interface server 10, equipment management server 14, and data collection server 16.

Data collection server 16 receives commands from operator interface server 10 to start processes in processing equipment 20, and transmits the received commands to device interface server 18. Data collection server 16 also collects data generated during the processes performed by processing equipment 20 in real time, and transmits the collected data to equipment management server 14. Equipment management server 14 provides process condition data for the processes to operator interface server 10.

Device interface server 18 provides an interface between the units of process equipment 20 and other components in the system. In particular, device interface server 18 is connected between the units of process equipment 20 and data collection server 16. Device interface server 18 receives process condition data from data collection server 16 and communicates the process condition data from data collection server 16 to process equipment 20.

Equipment management server 14 includes a database for storing the process condition data. The process condition data typically includes data such as statistical process control (SPC) data used to perform various processes.

Figure 2:
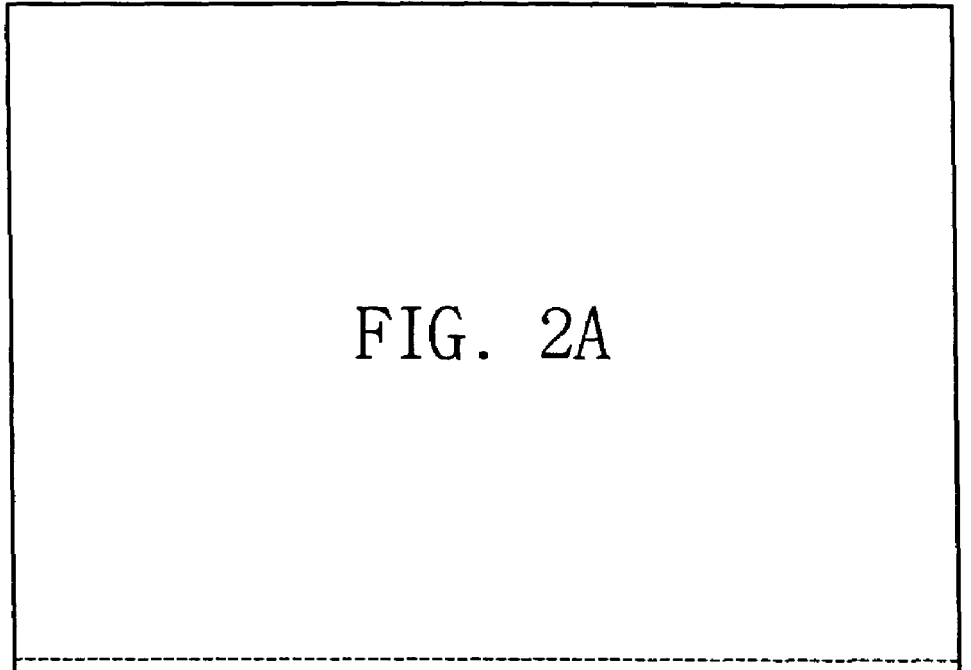
FIG. 2 is a flowchart illustrating a method for controlling the processing of a batch of wafer lots having a variable number of lots.
Figure 2:
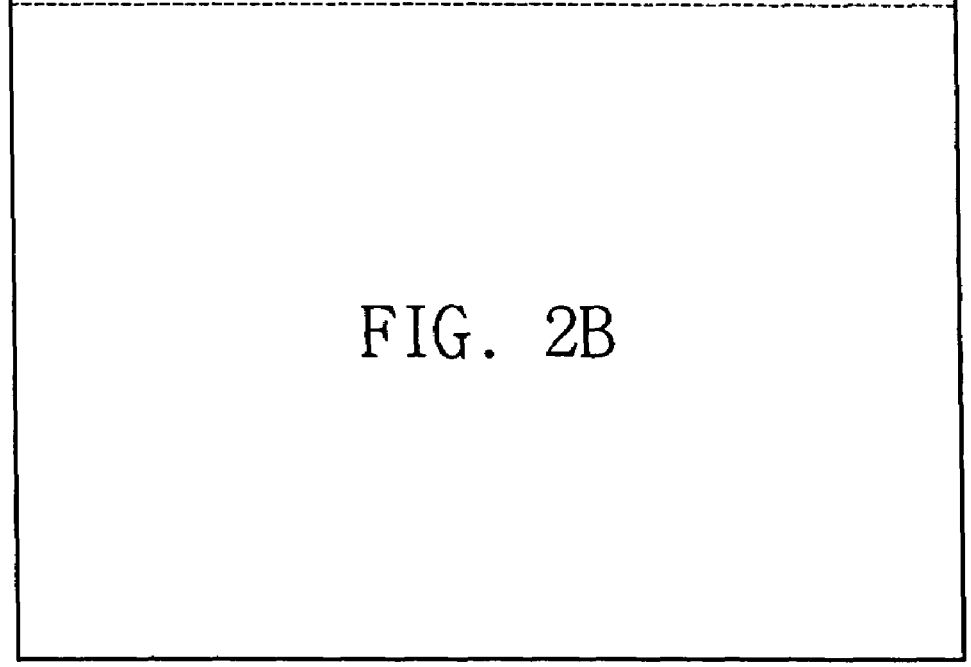
Figure 3:
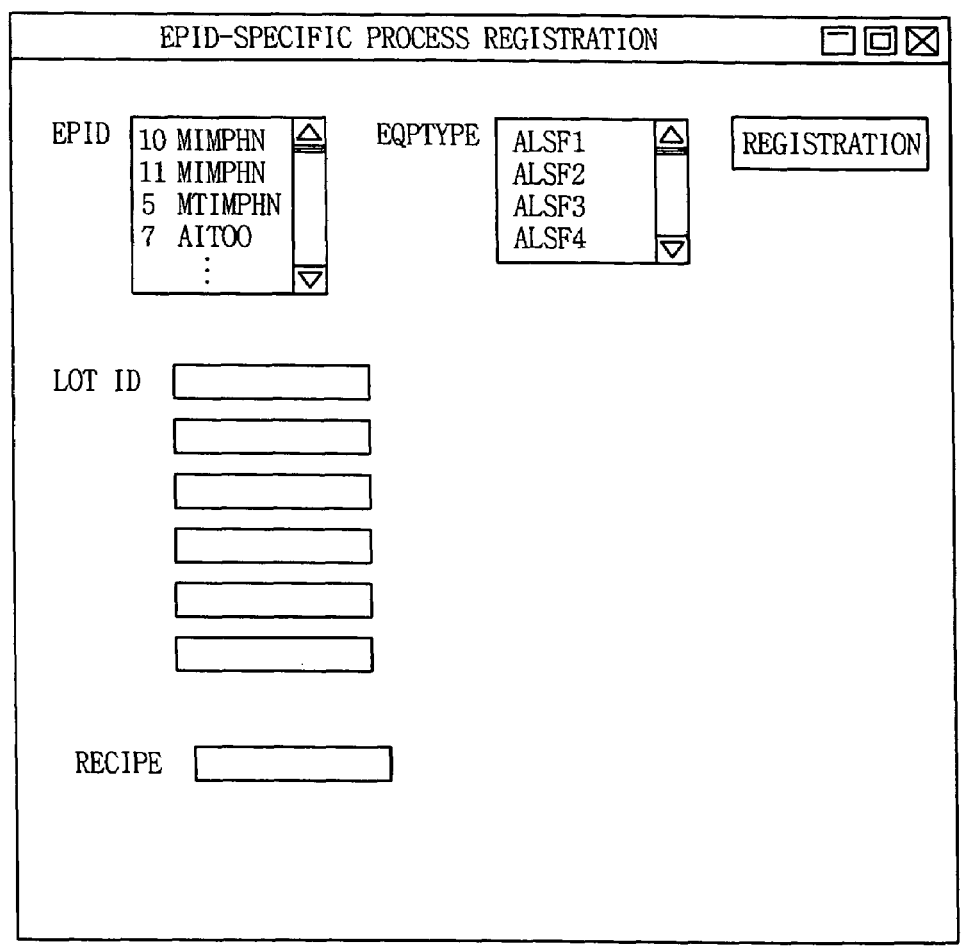
FIG. 3 is a diagram illustrating an example of a user interface for an operator interface server used to communicate information to a device interface server regarding how to process a batch of wafer lots; and, FIG. 4 is an example of a table illustrating sub-recipes used to process a batch of wafer lots.

FIG. 2 is a flowchart illustrating a method of controlling the processing of a batch of wafer lots containing a variable number of lots in accordance with one embodiment of the invention. FIG. 3 is a flow chart illustrating an example of a user interface for operator interface server 10 used to communicate information to device interface server 18 regarding how to process a batch of wafer lots. Finally, FIG. 4 is an example of a table illustrating sub-recipes used to process a batch of wafer lots in accordance with an embodiment of the present invention. The operation of various exemplary embodiments of the present invention will be described below with reference to FIGS. 1 through 4.

Operator interface server 10 receives a number of wafer lots designated to be loaded onto a selected unit of processing equipment 20 through an EPID-Specific Process Registration screen shown in FIG. 3. Operator interface server 10 then sends batch information to device interface server 18 via data collection server 16 to indicate whether or not to use a monitor wafer, and how many wafer lots are to be processed in each unit of processing equipment 20. Device interface server 18 uses the batch information to select recipes for processes to be performed in the respective units of processing equipment 20. In the recipes selected by device interface server 18, each batch is designated to have between 1 and 6 wafer lots.

Each piece of processing equipment 20 is connected with device interface server 18 through a local area network (LAN) cable. Device interface server 18 sets a sub-recipe having a specified name, number of wafer lots per batch, monitoring wafer indication, and associated processing conditions, in each unit of processing equipment 20 on the basis of the batch information received from operator interface server 10. The sub-recipes are set in processing equipment 20 while each unit of processing equipment 20 is in an idle mode.

The process of "setting" a sub-recipe in a unit of processing equipment 20 typically includes checking whether the sub-recipe is stored in the unit of processing equipment 20, and then upon determining that the sub-recipe is stored therein, selecting the sub-recipe for use in performing corresponding wafer processing functions.

Once a sub-recipe is successfully set in a corresponding a unit of processing equipment 20, the unit of processing equipment 20 is converted into a standby mode. Once all units of processing equipment 20 are converted into the standby mode, process recipes are set in the units of processing equipment 20 and the process recipes are used to carry out processing operations in the units of processing equipment 20. The process of "setting" a process recipe in a unit of processing equipment 20 is similar to the process of setting a sub-recipe in processing equipment 20; it includes checking whether the process recipe is stored in the unit processing equipment 20 and then upon determining that the process recipe is stored therein, selecting the process recipe for use in performing corresponding wafer processing functions.

At least one distinction between the sub-recipes and the process recipes mentioned above is that the sub-recipes are typically used to perform track-in operations, and the process recipes are generally used for other wafer processing operations performed by processing equipment 20.

Unfortunately, some sub-recipes may fail to be set in corresponding units of processing equipment 20. One reason for such failures may be that some sub-recipes are not stored in the corresponding units of processing equipment 20. Another reason is for the failure is that memories storing the sub-recipes in the units of processing equipment 20 may have been modified or corrupted so that even if a sub-recipe is present in the memory, device server 18 may not be able to select the sub-recipe.

Generally, if device interface server 18 is unable to select a sub-recipe stored in a unit of processing equipment 20 after repeated attempts, then the unit will remain in the idle mode, thus delaying wafer processing. To address this problem, device interface server 18 may reset the memories of units where it is unsuccessful in selecting sub-recipes.

Once sub-recipes are set in all units of processing equipment 20, all of the units are converted to the standby mode, allowing wafer processing to proceed.

FIG. 4 shows a table structure for sub-recipes set by device interface server 18 in the units of processing equipment 20. The table can take various alternative forms and FIG. 4 shows one of these forms. In FIG. 4, a sub-recipe with the specified name USE-MW1 is set in a unit of processing equipment 20 when the batch information from operator interface server 10 indicates that a batch containing 1 lot of wafers and using a monitoring wafer will be loaded into the unit. Similarly, a sub-recipe with the specified name NO-MW2 is set in a unit of processing equipment 20 when the batch information from operator interface server 10 indicates that a batch containing 2 lots of wafers and not using a monitoring wafer will be loaded into the unit. Other sub-recipes are similarly labeled in the table shown in FIG. 4.

Figure 2A:
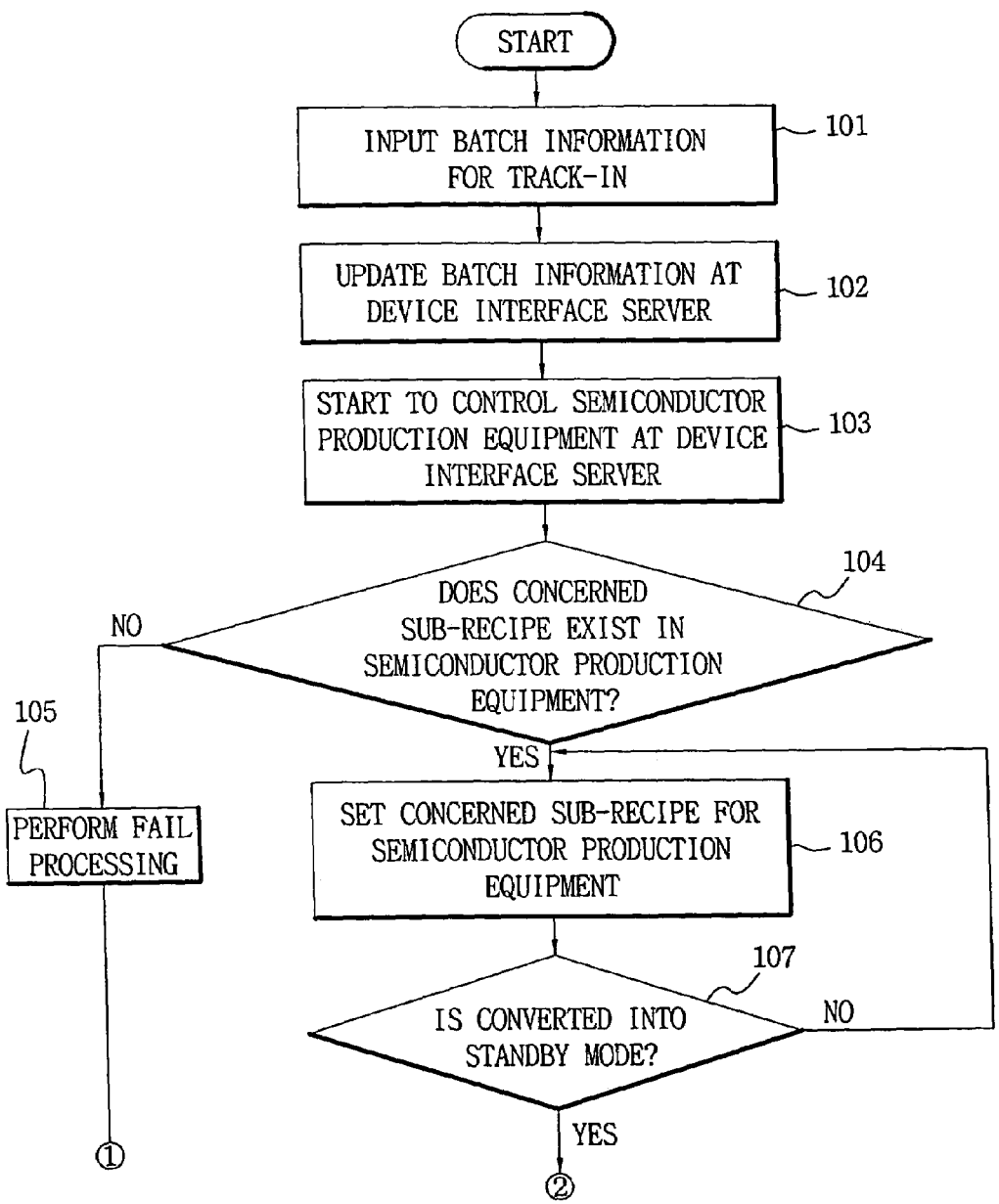
Figure 2B:
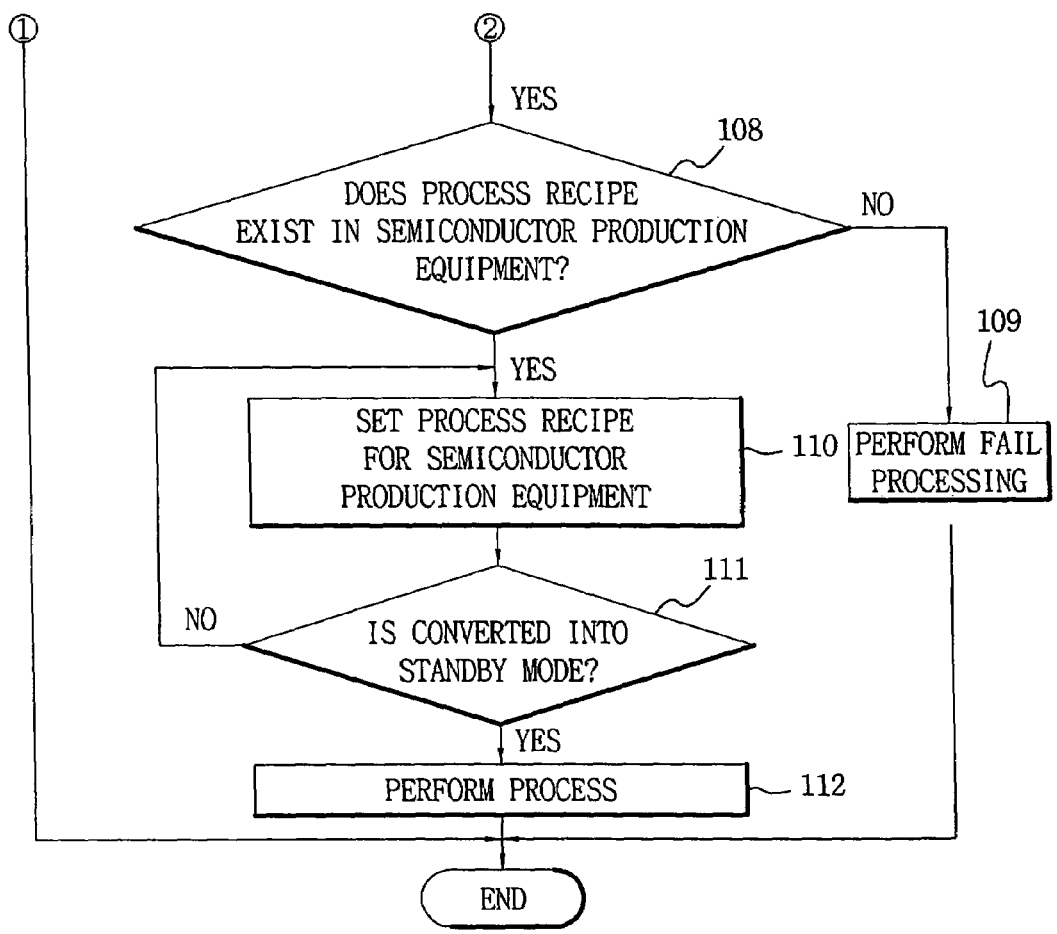

A method of controlling the processing of a batch of wafer lots using the system illustrated in FIG. 1 will be described in further detail below with reference to FIGS. 2 and 3. Referring to FIG. 2A, in a step 101, batch information for a track-in operation is input to operator interface server 10. The term "track-in" here denotes the placing of lots of wafers into a wafer track. For example, the batch information for the track-in operation contains the number of wafer lots that will be loaded into a wafer track, and whether or not a monitoring wafer will be used to monitor the wafers in those lots. The batch information is transferred from operator interface server 10 to data collection server 16, and from data collection server 16 to device interface server 18.

The batch information can be input to operator interface server 10 through a user interface such as the one shown in FIG. 3. For example, an operator using operator interface server 10 can choose to register an EPID-specific processes to bring up an EPID-Specific Process Registration screen such as that shown in FIG. 3. The screen provides EPID and EQPTYPE selection controls, wafer lot ID entry forms, and a recipe entry form, all of which allow the operator to control how processing equipment 20 will function during the wafer processing. A registration button is provided to control sending the batch information from operator interface server 10 to data collection server 16 through the bus. The batch information is transferred from data collection server 16 to device interface server 18 through a bus.

In a step 102, device interface server 18 receives and updates the batch information. The batch information used for track-in typically designates a number of wafer lots and use and non-use of the monitor wafer. In a step 103, device interface server 18 starts to control processing equipment 20. Then, in a step 104, device interface server 18 checks whether or not a selected sub-recipe is stored in a corresponding selected unit of processing equipment 20. If the selected sub-recipe is not stored in the selected unit of processing equipment 20, device interface server 18 performs failure processing in a step 105. The failure processing typically includes, for example, terminating the method and providing an indication of the failure to the operator through operator interface server 10. On the other hand, if the selected sub-recipe is stored in the selected unit of processing equipment 20, device interface server 18 proceeds to a step 106 and sets the selected sub-recipe in processing equipment 20.

Subsequently, device interface server 18 proceeds to a step 107 where it checks whether the selected unit of processing equipment 20 is converted into the standby mode or not. If the selected unit of processing equipment 20 is not converted into the standby mode, device interface server 18 repeats step 106. However, if the selected unit of processing equipment 20 is converted into the standby mode, device interface server 18 proceeds to a step 108.

In step 108, device interface server 18 checks whether or not a process recipe is stored in the selected unit of processing equipment 20. Where the process recipe is not stored in the selected unit of processing equipment 20, device interface server 18 proceeds to step 109 and performs failure processing similar to that performed in step 105. However, if the process recipe is stored in the selected unit of processing equipment 20, device interface server 18 proceeds to a step 110 to set the process recipe for the selected unit of processing equipment 20, and then proceeds to a step 111.

In step 111, device interface server 18 checks whether the selected unit of processing equipment 20 is converted into a standby mode or not. If the selected unit of processing equipment 20 is not converted into the standby mode, device interface server 18 repeats step 110. However, if the selected unit of processing equipment 20 is converted into the standby mode, device interface server 18 proceeds to a step 112 and causes the selected unit of processing equipment 20 to perform the process.

As mentioned above, embodiments of the present invention allow batch-type semiconductor processing equipment to adapt to a varying number of wafer lots per batch, and to the use or non-use of a monitoring wafer during wafer processing.

The foregoing preferred embodiments are teaching examples. Those of ordinary skill in the art will understand that various changes in form and details may be made to the exemplary embodiments without departing from the scope of the present invention as defined by the following claims.

What is claimed:

1. A semiconductor wafer processing apparatus capable of processing a batch of wafers having a variable number of wafer lots, the apparatus comprising:
    an operator interface server receiving inputs indicating process conditions for processing the batch of wafers in a selected unit of wafer processing equipment, the number of wafer lots in the batch of wafers, and whether or not to use a monitor wafer when processing the batch of wafers;
    an equipment management server providing the operator interface server with process condition data used to derive the process conditions; and,
    a device interface server providing a communication interface between the operator interface server and the selected unit of processing equipment, wherein the device interface server receives batch information for a track-in operation from the operator interface server, and sets a recipe in the selected unit of processing equipment based on the batch information.

2. The apparatus of claim 1, wherein the batch information comprises the number of wafer lots in the batch of wafers, and an indication of whether or not a monitoring wafer is to be used when processing the batch of wafers.

3. The apparatus of claim 2, wherein the device interface server attempts to set a sub-recipe in the selected unit of processing equipment, and resets the sub-recipe in the selected unit of processing equipment if the attempt to set the sub-recipe fails.

4. The apparatus of claim 3, wherein the device interface server attempts to set a process-recipe in the selected unit of processing equipment, and resets the process-recipe in the selected unit of processing equipment if the attempt to set the process-recipe fails.

5. The apparatus of claim 1, further comprising a user interface server operatively connected to the operator interface server and the device interface server, wherein the user interface server provides a user interface that allows an engineer to inspect various states of the selected unit of processing equipment from a remote location.

6. The apparatus of claim 1, further comprising a data collection server operatively connected between the operator interface server and the device interface server, and also between the equipment management server and the device interface server;
    wherein the data collection server receives commands from the operator interface server to start processes in the selected unit of processing equipment and transmits the received commands to the device interface server; and,
    wherein the data collection server collects data generated during processes performed by the selected unit of processing equipment in real time and transmits the collected data to the equipment management server.

7. The apparatus of claim 6, wherein the equipment management server further comprises a database storing recipes used by the selected unit of processing equipment.

8. A method of processing a batch wafers having a variable number of wafer lots using a semiconductor wafer processing apparatus comprising an operator interface server adapted to receive batch information for a track-in operation, an equipment management server adapted to store data used to process the batch of wafers, and a device interface server adapted to control a selected unit of processing equipment used to process the batch of wafers, the method comprising:
    inputting the batch information for the track-in operation to the operator interface server;
    transmitting the batch information to the device interface server and updating the batch information in the device interface server;
    setting a sub-recipe in the selected unit of the processing equipment after updating the batch information;
    setting a process recipe in the selected unit of processing equipment after setting the sub-recipe; and,
    processing the batch of wafers in the selected unit of processing equipment based on the process recipe.

9. The method of claim 8, wherein the batch information for the track-in operation comprises the number of wafer lots in the batch of wafers, and an indication of whether or not a monitoring wafer is to be used when processing the batch of wafers.

10. The method of claim 8, wherein setting the sub-recipe in the selected unit of the processing equipment comprises:
    determining whether the sub-recipe is stored in the selected unit of processing equipment;
    upon determining that the sub-recipe is stored in the selected unit of processing equipment, selecting the sub-recipe for use in a process to be performed by the selected unit of processing equipment; and,
    upon determining that the sub-recipe is not stored in the selected unit of processing equipment, performing failure processing.

11. The method of claim 10, further comprising:
    upon failing to select the sub-recipe for use in the process to be performed by the selected unit of processing equipment, resetting the sub-recipe in the selected unit of processing equipment.

12. The method of claim 10, wherein setting the process recipe in the selected unit of processing equipment comprises:
    determining whether the process recipe is stored in the selected unit of processing equipment;
    upon determining that the process recipe is stored in the selected unit of processing equipment, selecting the process recipe for use in a process to be performed by the selected unit of processing equipment; and,
    upon determining that the process recipe is not stored in the selected unit of processing equipment, performing failure processing.

13. The method of claim 12, further comprising:

upon failing to select the process recipe for use in the process to be performed by the selected unit of processing equipment, resetting the process recipe in the selected unit of processing equipment.

14. A method of processing a batch of wafers containing a variable number of wafer lots in a semiconductor apparatus comprising an operator interface server adapted to receive batch information for a track-in operation, an equipment management server adapted to store data used to process the batch of wafers, and a device interface server adapted to control a selected unit of processing equipment used to process the batch of wafers, the method comprising:

inputting batch information to the operator interface server, wherein the batch information indicates the number of wafer lots in the batch of wafers and whether or not to use a monitor wafer to monitor the processes performed on the batch of wafers;

transmitting the batch information to the device interface server and updating the batch information in a device interface server;

determining whether a sub-recipe is stored in a selected unit of processing equipment after updating the batch information;

performing failure processing when the sub-recipe is not present in the selected unit of processing equipment;

setting the sub-recipe in the selected unit of processing equipment when the sub-recipe is present in the selected processing equipment;

determining whether or not the selected unit of processing equipment becomes converted into a standby mode after the sub-recipe is set;

determining whether or not a process recipe is stored in the selected unit of processing equipment after the selected unit of processing equipment is converted into the standby mode;

setting the process recipe in the selected unit of processing equipment when the process recipe is stored in the selected unit of processing equipment;

determining whether or not the selected unit of processing equipment becomes converted into the standby mode after the process recipe is set; and, processing the batch of wafers according to the process recipe when the selected unit of processing equipment is converted into the standby mode.

15. The method according to claim 14, further comprising:

resetting the sub-recipe in the selected unit of processing equipment upon determining that the selected unit of processing equipment is not converted into the standby mode after the sub-recipe is set therein.

16. The method according to claim 15, further comprising:

resetting the process recipe in the selected unit of processing equipment upon determining that the selected unit of processing equipment is not converted into the standby mode after the process recipe is set.

* * * * *